(12) United States Patent
Andresen et al.

(10) Patent No.: US 6,310,379 B1
(45) Date of Patent: Oct. 30, 2001

(54) NMOS TRIGGERED NMOS ESD PROTECTION CIRCUIT USING LOW VOLTAGE NMOS TRANSISTORS

(75) Inventors: Bernhard H. Andresen, Dallas; Roger A. Cline, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/325,527

(22) Filed: Jun. 3, 1999

(51) Int. Cl.$^7$ ................................................ H01L 29/78
(52) U.S. Cl. ........................ 257/355; 257/362; 257/369
(58) Field of Search ................................ 257/355, 369, 257/362

(56) References Cited

U.S. PATENT DOCUMENTS

| | | | |
|---|---|---|---|
| 4,855,620 | 8/1989 | Duvvury et al. | 307/448 |
| 4,896,243 | 1/1990 | Chatterjee et al. | 362/91 |
| 5,404,041 | 4/1995 | Diaz et al. | 257/360 |
| 5,450,267 | 9/1995 | Diaz et al. | 361/56 |
| 5,468,667 | 11/1995 | Diaz et al. | 437/50 |
| 5,528,188 | 6/1996 | Au et al. | 327/310 |
| 5,637,892 | 6/1997 | Leach | 257/362 |
| 5,719,427 | * 2/1998 | Tong et al. . | |
| 5,726,478 | * 3/1998 | Gantioler et al. . | |
| 5,818,088 | * 10/1998 | Ellis . | |
| 5,936,282 | * 8/1999 | Baba et al. . | |

OTHER PUBLICATIONS

Singh, Gajendra, et al; Sun Microsystems, Inc./Silicon Technology Development, Texas Instruments, 4kV ESD Protection for Mixed Voltage IOs in a 400 MHz Microprocessor, presented at DesignCon '99, Jan., 1992, 2 pages.

Amerasekera, Ajith & Duvvury, Charvaka, ESD in Silicon Integrated Circuits (1995); pp. 55–134.

Ramaswamy, S., et al; EOS/ESD Reliability of Deep Sub-Micron NMOS Protection Devices, Int'l Reliability Physics Symposium (IRPS) (1995).

Ramaswamy, S., et al.; EOS/ESD Analysis of High–Density Logic Chips, Univ. of Ill/Texas Instruments Incorporated, unnumbered and undated.

Duvvury, C., et al., ESD: A Pervasive Reliability Concern for IC Technologies, vol. 81, No. 5, Proc. IEEE, May 1993, pp. 691–702.

* cited by examiner

*Primary Examiner*—Stephen D. Meier
(74) *Attorney, Agent, or Firm*—Gerald E. Laws; W. James Brady, III; Frederick J. Telecky, Jr.

(57) ABSTRACT

An integrated circuit is provided with electrostatic discharge (ESD) protection circuitry (120) which uses low voltage transistors (N1, N2) to provide protection to a signal pad that handles high voltage signals during normal operation of the integrated circuit. The external signal is operable at a second supply voltage that is higher than the Vdd supply voltage. The internal circuitry of the integrated circuit is comprised of MOS transistors that have gate oxide of a first thickness that has a $V_{ox-max}$ suitable for the Vdd supply voltage but not for the second supply voltage. The ESD protection transistors use the same gate oxide thickness as the MOS transistors used in the internal circuitry. A substrate region in the semiconductor substrate is enclosed by a highly doped region (250) so that the back-gates of the ESD protection transistors can be voltage pumped by pump circuitry (202) in order to trigger bipolar conduction of the ESD protection transistors at a lower voltage. Control circuitry (204) is connected to the signal bond pad and to gates of the ESD protection transistors and to gates of the pump transistors to provide a voltage pulse to each gate in response to an ESD zap applied to the signal bond pad. The control circuitry provides a bias potential to the gates of the ESD protection transistors and pump transistors such that the maximum operating voltage of the gate oxide of each device is not exceeded during normal operation of the integrated circuit, thereby avoiding electrical over-stress (EOS) of the low voltage devices in the ESD protection circuitry.

12 Claims, 3 Drawing Sheets

NMOS TRIGGERED NMOS ESD PROTECTION CIRCUIT USING LOW VOLTAGE NMOS TRANSISTORS

FIELD OF THE INVENTION

The present invention relates to Electrical Over-Stress (EOS) and Electrostatic Discharge (ESD) protection in high density integrated circuits.

BACKGROUND OF THE INVENTION

Modern integrated circuits are easily damaged by excess voltages, and one common source of such potentially damaging voltages is caused when two materials are rubbed together. A person can develop very high static voltage, from a few hundred to several thousand volts, simply by walking across a room or by removing an IC from its plastic package, even when careful handling procedures are followed. The impact of ESD damage due to handling and testing can have a significant influence on product yield. Large ICs manufactured in advanced processes may only have 30 to 40 chips per six inch wafer. Any product loss due to ESD damage has a direct impact on profitability and even fall-outs of the order of 1% are not acceptable. Another issue which gives increasing importance to ESD control is the move towards replaceable ICs in electronic systems. Instead of replacing the whole circuit board, as used to be the standard practice, users are now encouraged to purchase upgrades to their microprocessors and memory cards and perform the installation themselves. Since the installation does not necessarily take place in an ESD-safe environment, the ICs need to be ESD robust.

The major source of ESD exposure to ICs is from the human body, and is known as the Human Body Model (HBM) ESD source. A charge of about 0.6 C can be induced on a body capacitance of 150 pF, leading to electrostatic potentials of 4 kV or greater. Any contact by a charged human body with a grounded object, such as the pin of an IC, can result in a discharge for about 100 ns with peak currents of several amperes to the IC.

A second source of ESD is from metallic objects, and is known as the machine model (MM) ESD source. The MM ESD source is characterized by a greater capacitance and lower internal resistance than the HBM ESD source. The MM ESD model can result in ESD transients with significantly higher rise times than the HBM ESD source.

A third ESD model is the charged device model (CDM). Unlike the HBM ESD source and the MM ESD source, the CDM ESD source includes situations where the IC itself becomes charged and discharges to ground. Thus, the ESD discharge current flows in the opposite direction in the IC than that of the HBM ESD source and the MM ESD source. CDM pulses also have very fast rise times compared to the HBM ESD source.

A longstanding problem is that if such a high voltage is accidentally applied to the pins of an IC package, the discharge can cause gate oxide breakdown of the devices to which it is applied. The breakdown may cause immediate destruction of the device, or it may weaken the oxide enough such that failure may occur early in the operating life of the device and thereby cause later device failure in the field.

In MOS integrated circuits, the inputs are normally connected to drive the gate of one or more MOS transistors. The term "MOS" is used in this application, as is now conventional, to refer to any insulated-gate-field-effect-transistor, or to integrated circuits which include such transistors. Furthermore, all pins are provided with protective circuits to prevent voltages from damaging the MOS gates. These protective circuits, normally placed between the input and output pads on a chip and the transistor gates to which the pads are connected, are designed to begin conducting, or to undergo breakdown, thereby providing an electrical path to ground (or to the power-supply rail) when excess voltage occurs. Such protection devices are designed to avalanche (passing a large amount of current, and dissipating the energy of the incoming transient) before the voltage on the input pin can reach levels which would damage the gate oxide. Since the breakdown mechanism is designed to be nondestructive, the protective circuits provide a normally open path that closes only when the high voltage appears at the input or output terminals, harmlessly discharging the node to which it is connected.

However, technological advances are leading to the creation of smaller and faster components that are increasingly more fragile. The output stages of MOS circuits which, until now, have been capable of withstanding high discharge currents, are becoming more vulnerable. In particular, the advantages of the various techniques for improving the performance characteristics of integrated circuits are offset by increased sensitivity to over-voltages or discharges. Breakdown voltages of the junctions or punch-through voltages between drain and source of the MOS transistors are becoming lower and the gate oxide is more fragile.

ESD protection for MOS output buffers has typically relied on a parasitic lateral bipolar transistor of the MOS devices. When the voltage reaches the breakdown voltage of the devices, the lateral transistors should turn on and clamp the pad voltage at a sufficiently low voltage to protect the output buffer. The devices typically have a snap-back characteristic during breakdown. The parasitic transistor triggers at a high voltage and snaps-back to a lower voltage to clamp the pad voltage. However, a portion of the MOS device can trigger and snap-back to a lower voltage and conduct all of the current. When this happens, this part can be destroyed before the voltage rises high enough to trigger the rest of the device. This is especially a problem for devices with low resistance substrates, since the substrate is the base of the parasitic lateral transistors and the base is difficult to forward bias if it is low resistance. Low resistance substrates are desirably used on CMOS circuits to prevent latchup of parasitic SCRs in normal operation, however, this conflicts with the use of SCRs for ESD protection.

As integrated circuits (ICs) become more complicated and, as a result, denser, the metal-oxide-semiconductor (MOS) circuit elements that make up the IC must become smaller. As the size of a MOS circuit element shrinks, its operating voltage also tends to drop. In the past, the standard operating voltage of MOS circuit elements was 5V. Newer designs are using operating voltages in the 2.5 to 3.3 volt range. For compatibility, it is desirable for the newer designs to be able to withstand 5V signals. Unfortunately, technologies developed for 3V operation have thin gate oxides, on the order of 100 angstroms. If a thin oxide device designed for 3V operation were instead operated at 5V, the device would have accelerated wear-out due to reduced gate oxide reliability.

ESD protection circuits using MOS circuit elements must be designed to avoid having the oxides stressed by a 5V bond pad voltage during normal operation. At the same time, the protection circuit must turn-on and provide good ESD protection during ESD stress. One prior art solution uses two gate oxide thicknesses. A thinner oxide is used for the internal functional circuitry and a thicker oxide is used for circuitry connected directly to a bond pad. Unfortunately, this adds process complexity by requiring two gate oxide formations. Thus, there is a need for ESD protection circuitry that will not be stressed during 5V operation and that minimizes process complexity.

Because of the importance of ESD protection, it is desirable to improve and provide alternative ESD protection circuits.

Other objects and advantages will be apparent to those of ordinary skill in the art having reference to the following figures and specification.

SUMMARY OF THE INVENTION

In general, and in an embodiment of the present invention, an integrated circuit is provided with ESD protection circuitry which uses low voltage transistors to provide protection to a signal pad that handles high voltage signals during normal operation of the integrated circuit. The integrated circuit has a semiconductor substrate connected to a bond pad for a Vss reference supply voltage and a bus for a Vdd supply voltage. At least one signal bond pad is provided for connecting to an external signal, wherein the external signal is operable at a second supply voltage that is higher than the Vdd supply voltage. The internal circuitry of the integrated circuit is comprised of MOS transistors that have gate oxide of a first thickness that has a $V_{ox-max}$ suitable for the Vdd supply voltage but not for the second supply voltage. ESD circuitry is connected between the signal pad and a reference supply voltage bond pad. A substrate region in the semiconductor substrate is enclosed by a highly doped region. A first string of cascode connected MOS transistors is provided which each have gate oxide of the first thickness, and each have a backgate in the enclosed substrate region. There is a first source/drain connected to the signal pond pad, a last source/drain connected to the reference supply voltage bond pad, and a separate control gate associated with each of the MOS transistors in the first string. A second string of cascode connected MOS transistors is provided to pump the enclosed substrate region that also have a gate oxide of the first thickness. There is a first source/drain connected to the signal pond pad, a last source/drain connected to the highly doped region, and a separate control gate associated with each of the MOS transistors in the second string. There is control circuitry connected to the first signal bond pad and to each of the gates in the first string and the second string operable to provide a voltage pulse to each gate in the first string and to each gate in the second string in response to an ESD zap applied to the first signal bond pad.

In accordance with another aspect the present invention, the control circuitry includes timing circuitry to control the magnitude and duration of the voltage pulse provided to the gates in the first and second string in response to an ESD zap.

In accordance with another aspect of the present invention, the control circuitry provides a bias potential to the gates of the first and second string of transistors such that the maximum operating voltage of the gate oxide of each device is not exceeded during normal operation of the integrated circuit.

Other embodiments of the present invention will be evident from the description and drawings.

BRIEF DESCRIPTION OF THE DRAWINGS

Other features and advantages of the present invention will become apparent by reference to the following detailed description when considered in conjunction with the accompanying drawings, in which.

Corresponding numerals and symbols in the different figures and tables refer to corresponding parts unless otherwise indicated.

DETAILED DESCRIPTION OF EMBODIMENTS OF THE INVENTION

Providing high voltage operation for low voltage CMOS input/output buffers is needed in order to allow interoperability of integrated circuits designed for 3.3 volt operation with older integrated circuits designed for 5 volt operation, for example. The term 'high voltage' is used here to describe a voltage higher than the allowable transistor gate to other terminal voltage for a given CMOS process. The term 'low voltage', by contrast, is used to refer to the usual $V_{DD}$ supply voltage applied to the integrated circuit power terminals. In an embodiment of the current invention, the predominant high voltage application is 5 volts for use with a CMOS low voltage $V_{DD}$ supply of 3.3 volts. Briefly stated, 5 volt tolerant operation means that a buffer can function with 5 volts applied to its bond pad terminal while the integrated circuit is powered with 3.3 volts. Specifications for 5 volt tolerant circuits define maximum current flow into the bond pad terminal of a buffer when driven with 5 volts. No appreciable degradation of this specification is allowed over the lifetime of the integrated circuit.

Figure 1:
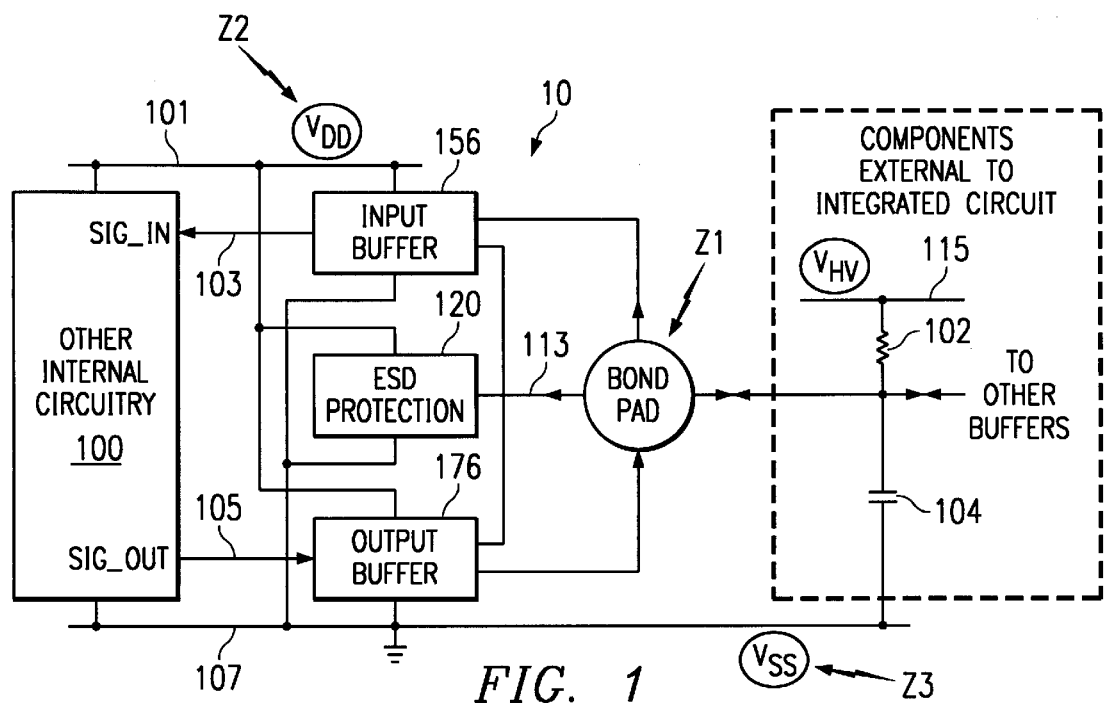
FIG. 1 is a schematic diagram of an integrated circuit with improved ESD protection, according to an aspect of the present invention.

A block diagram of an integrated circuit 10 with a high voltage tolerant buffer system is shown in FIG. 1. A single DC supply voltage of 3.3 volts is connected between positive terminal $V_{DD}$, node 101, and Vss reference terminal 107. Reference terminal 107 is typically connected to ground, or 0 volts. Components that are external to the integrated circuit are shown in the dashed box. An external voltage ranging from 0 to 5 volts is applied to the bond pad of the buffer from external high voltage supply, VHV, node 115, through external resistor 102. Note that component 102 is not necessarily a resistor but can be any device that limits the current from the 5 volt external supply to the maximum value allowed in the system specifications.

External component 104 is a capacitor representing the maximum capacitive system load that an output buffer must discharge to meet its specified timing requirements in the application. Internal signals are generated in the Other Internal Circuitry block 100 which sends logic signals to an output buffer block 176 and/or receives logic signals from an input buffer block 156.

Suitable buffers for high voltage operation are described in U.S. patent application Ser. No. 09/464,666 entitled "Method of Designing Fail-Safe CMOS I/O Buffers Whose External Nodes Accept Voltages Higher than the Maximum Gate Oxide Operation Voltage", incorporated herein by reference. An open collector style output buffer would have a cascode N-channel transistor in the pull-down portion of the circuit, while a tristate push-pull output circuit would have not only the cascode N-channel transistor in the pull-down portion of the circuit, but would also have a series or cascode connected P-channel transistor in the pull-up portion of the circuit. Cascode-connected transistors would be driven at their gate terminals by a bias supply circuit in order to maintain safe gate oxide voltage operating levels.

Input/output buffer bond pad 113 is driven by an output buffer block 176, and the bond pad also supplies a signal to an input buffer block 156, thereby functioning bidirectionally. Other buffers external to this integrated circuit may be present in the system. The voltage at the bond pad 113 will be at a level between 0 volts and 5 volts at any time, either due to the operation of output buffer block 176 or an output buffer external to the integrated circuit.

The Other Internal Circuitry block 100 represents the remainder of the integrated circuit components and is responsible for processing the signals to and from the input/output circuitry at this bonding pad.

The input/output buffer 156/176 and internal circuitry 100 are advantageously improved and protected from an ESD (electrostatic discharge) event Z1-Z3 to any of the bond pads or pins of the chip by the provision of ESD protection circuitry 120. Aspects of the present invention relate to protecting against zap Z1 on the signal bond pad 113. Zaps on $V_{DD}$ power pad 101 and $V_{ss}$ pad 107 are protected against by various diodes, transistors, and resistors, such as described in U.S. Pat. No. 5,637,892, entitled "Electrostatic Discharge Protection in Integrated Circuits, Systems, and Methods," and incorporated herein by reference.

An ESD event is called a "zap" herein because some ESD causes a pulse, spark or sound which the word "zap" concisely represents. ESD zaps can occur from static electricity discharges from persons installing or removing an integrated circuit chip. Also, any sudden discharge or other undesirable potential difference applied to the chip due to a surge in an industrial, office, home or field environment can be an ESD event of interest herein.

Before an ESD zap, the bond pads for VDD in FIG. 1 are initially at 0 volts due to substrate leakage currents. If output pad 113 is zapped positive by zap Z1 with Vss terminal 107 as reference, transistor ESD circuitry 120 is triggered and clamps the voltage on output pad 113 to a value that is less then a breakdown voltage of I/O buffers 156/176.

Vt1 is the first turn-on voltage of a parasitic lateral npn (LNPN) transistor associated with an NMOS transistor. Vt2 is the second breakdown voltage and Vsp is the snapback voltage. If applied voltage exceeds beyond the second breakdown voltage, the NMOS transistor enters the regime of thermal runaway which can result in damage to the NMOS transistor. The corresponding second breakdown current (It2) is the corresponding current for Vt2, and is a key process ESD parameter for monitoring the high current handling capability of an NMOS transistor. When an NMOS transistor operates in the snapback mode or the bipolar breakdown region, the lateral NPN (LNPN) of the NMOS conducts most of the drain terminal current. It has been found that It2 strongly depends on the Beta of the LNPN, the NMOS channel length, the silicide thickness, the drain junction depth, and the epi layer thickness. An improved It2 can result from an optimized process.

Figure 2:
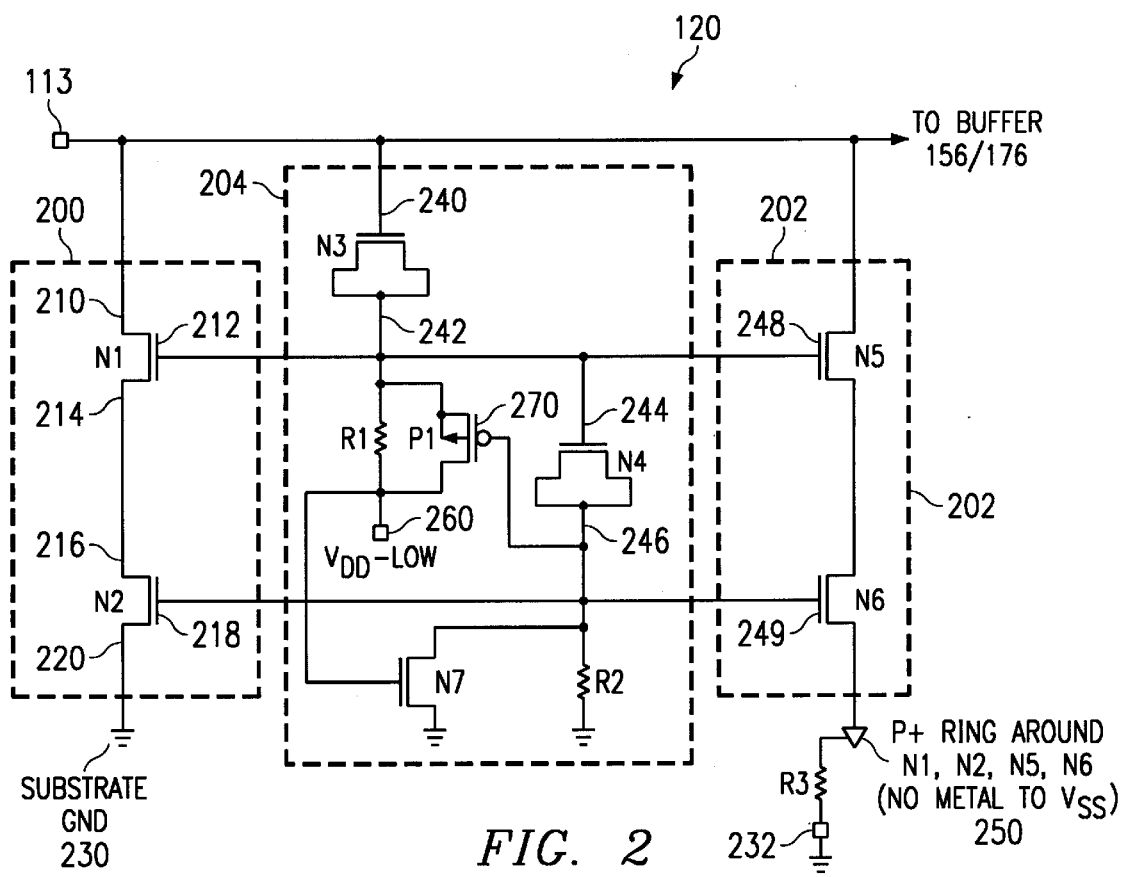
FIG. 2 is a schematic diagram of the ESD protection circuitry of FIG. 1.

FIG. 2 is a schematic of ESD protection circuitry 120, according to an aspect of the present invention. It uses a string of cascode connected low voltage transistors N1 and N2 in a gate coupled scheme which advantageously uses no DC current and does not need a clamp diode to $V_{DD}$ supply.

In operation, the only limitation is to sequence low and high voltage supplies such that $V_{DD}$ high–$V_{DD}$ low is less than or equal to $V_{DD}$ low and $V_{DD}$ high <2×$V_{DD}$ high. N1 and N2 form a gate coupled cascode device (GCD) 200 which operates in bipolar snapback to protect other circuits. The width of these transistors is set by $I_{T2}$ of the process. "Pumping" of the substrate aids turn on of the bipolar structure, as described in U.S. patent application Ser. No. 08/795,435 (TI-19439) now U.S. Pat. No. 5,847,258 entitled "Improved Semiconductor ESD Protection Circuit" and incorporated herein by reference. The term "gate coupled device" is a descriptive term. It does not describe a special type of device but rather that the gate is being coupled in some manner to a moving signal. In this case, the gate is coupled by a capacitor to the moving bond pad signal. The term "cascode device" or "cascode connected transistors" means a serial string of transistors connected in a source to drain fashion.

When an electrostatic discharge is received at bond pad 113, a high voltage initially appears on drain 210 of NMOS transistor N1. Due to capacitive coupling between drain 210 and gate electrode 212, the voltage will quickly rise on gate electrode 212 as well. Due to coupling between gate electrode 212 and source 214 of NMOS transistor N1 and capacitive coupling between drain 216 and gate electrode 218 of NMOS transistor N2, the voltage also rises quickly on gate electrode 218 of NMOS transistor N2. Source 220 of transistor N2 is connected to Vss reference voltage pad 232. The pad voltage on bond pad 113 rises until the combined breakdown voltage of MOS transistors N1 and N2 is reached. Allowing gate electrodes 212 and 218 to attain a potential during an electrostatic discharge causes lowering of the breakdown voltage of MOS transistors N1 and N2 compared to the breakdown voltage that would result if gate electrodes 212 and 218 were connected to ground. Once the combined breakdown voltage of N1 and N2 is reached, then the voltage on bond pad 113 decays to a level of the combined snapback holding voltage of NMOS transistors N1 and N2.

N3 and N4 are capacitors connected to signal bond pad 113 to pull the gates of N1, N2, N5 and N6 positive on a positive ESD strike on signal bond pad 113, and advantageously increases the gate voltage over what would result with only the gate coupling action described above. Terminal 240 of capacitor N3 is connected directly to signal bond pad 113 and terminal 242 is connected to gate 212 of GCD N1 and to the gate of pumping transistor N5. Capacitor N4 is connected to bond pad 113 serially via capacitor N3. Terminal 246 of capacitor N4 is connected to gate 218 of GCD N2 and to the gate of pump transistor N6. In an alternative embodiment, N4 could be a thick oxide transistor with terminal 244 connected directly to pad 113 instead of to terminal 242 of capacitor N3, as shown. However, it is useful to eliminate high voltage transistors in a high voltage tolerant implementation.

Pump circuitry 202 is a series connected string of transistors N5 and N6 are cascode source followers tied to a P+ ring 250 in the semiconductor substrate. Drain 248 of transistor N5 is connected to signal pad 113. Source 249 of transistor N6 is connected to P+ ring 250. P+ ring 250 surrounds GCD 200 and encloses the substrate region in which GCD 200 is formed. This ring is not hard wired to Vss reference pad 232, rather it sees a resistance R3 due to the resistance of semiconductor substrate 230. On a positive ESD strike, N5 and N6 pump the ring and substrate region around GCD 200 to help initiate the bipolar action of transistors N1 and N2.

Control circuitry 204 is connected to signal bond pad 113 and to each of the gates in the string of transistors in GCD circuitry 200 and to each of the gates in the string of transistors in pump circuitry 204. Control circuitry 204 is operable to provide a voltage pulse to each gate in the first string and to each gate in the second string in response to an ESD zap applied to signal bond pad 113 so that GCD transistors N1 and N2 are triggered to operate in bipolar snap back mode to protect buffer circuitry 156/176. After triggering N1 and N2, control circuitry 204 reduces the voltage pulses applied to the gates of N1, N2, N5 and N6 before the gate oxide of these transistors is damaged. During normal operation of integrated circuit 10, control circuitry 204 provides a gate bias to each of transistors N1, N2, N5, and N6 that does not exceed the allowable operating gate voltage for low voltage transistors.

R1 and R2 are sized with capacitors N3/N4 to allow the nodes being pumped to achieve proper voltage levels to trigger bipolar conduction. The area of capacitors N3/N4 in this embodiment is approximately 60um$^2$ on silicon. The actual capacitance will vary depending on the oxide thickness for a given technology. The typical resistance for the R1/R2 resistors is 15 kohms.

During normal operation of integrated circuit 10, N7 turns on when $V_{DD}$ low is applied to Vdd terminal 260 to short out R2 and keep transistor N2 turned off. This lowers effective capacitance of the signal pad. It also turns on P1. P1 shorts out R1 and ties the gates of the transistor N1 and N5 to $V_{DD}$ low through a low impedance . This prevents them from varying in voltage during normal output transitions on signal pad 113 due to gate-drain and gate-source capacitance. The back gate of P1 is tied to source 270 of P1. It cannot be tied to $V_{DD}$ low or it would defeat the pumping action.

Thus, during normal operation of internal circuitry 100 of integrated circuit 10, gate 212 of transistor N1 and the gate of transistor N5 are held at approximately 3.3 volts, since Vdd in this embodiment is 3.3 volts. Likewise, gate 218 of transistor N2 and the gate of transistor N6 are held at approximately 0 volts such that transistors N2 and N6 are turned off. Advantageously, a gate-drain voltage Vgd across each of transistors N1, N2, N5, and N6 does not exceed 3.3 volts. Therefore, the string of transistors comprising GCD 200 and the string of transistors comprising pump circuitry 202 are advantageously made using the same gate oxide thickness as the transistors used within internal circuitry 100.

Figure 3:
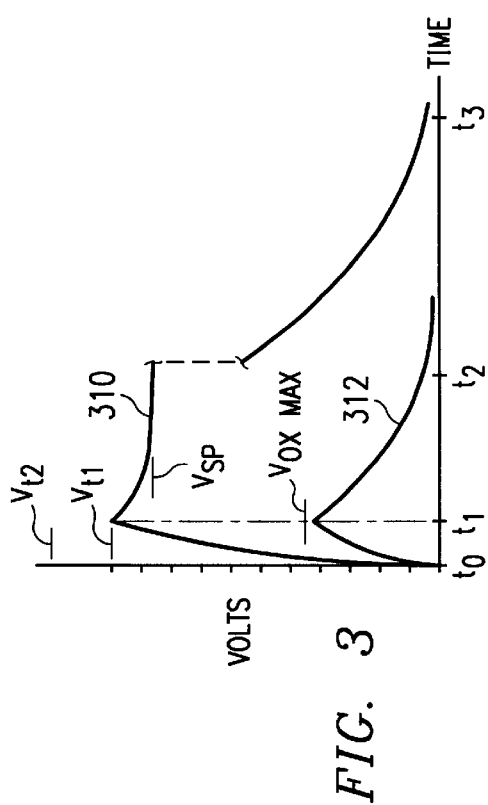
FIG. 3 illustrates operation of the ESD protection circuitry of FIG. 1 during an ESD zap event.

FIG. 3 illustrates operation of ESD protection circuitry 120 during an ESD zap event. At the onset of a zap at time $t_0$, voltage on signal pad 113 starts to rapidly rise, as indicated by curve 310. Simultaneously, a gate-source voltage on each of transistors N1, N2, N5, and N6 starts to rise due to zap voltage transferred by capacitors N3 and N4, as collectively represented by curve 312. At time $t_1$, transistors N1 and N2 are triggered into bipolar conduction after reaching trigger voltage $V_{t1}$. Capacitors N3 and N4 and resistors R1 and R2 are selected so that time $t_1$ is typically approximately 2–10 ns. Transistors N1 and N2 must be triggered into bipolar conduction before voltage on pad 113 reaches a level that will damage the gate oxide of any transistor on integrated circuit 10. Due to the resulting high current flow of approximately 2–3 amps through transistors N1 and N2, voltage on signal pad 113 reduces to approximately the combined snap back voltage $V_{sp}$ of transistors N1 and N2. This voltage level is maintained until the energy of the zap is expended at time $t_2$ and then decays to nothing after time $t_3$, which is typically 150–250 ns. After time $t_1$, gate-source voltage 312 decays due to the action of resistors R1 and R2.

Still referring to FIG. 3, during normal operation of integrated circuit 10, control circuitry 204 provides bias to the gates of N1, N2, N5 and N6 so that gate-source voltage 312 does not exceed a maximum oxide voltage $V_{ox-max}$, as described above.

Figure 4:
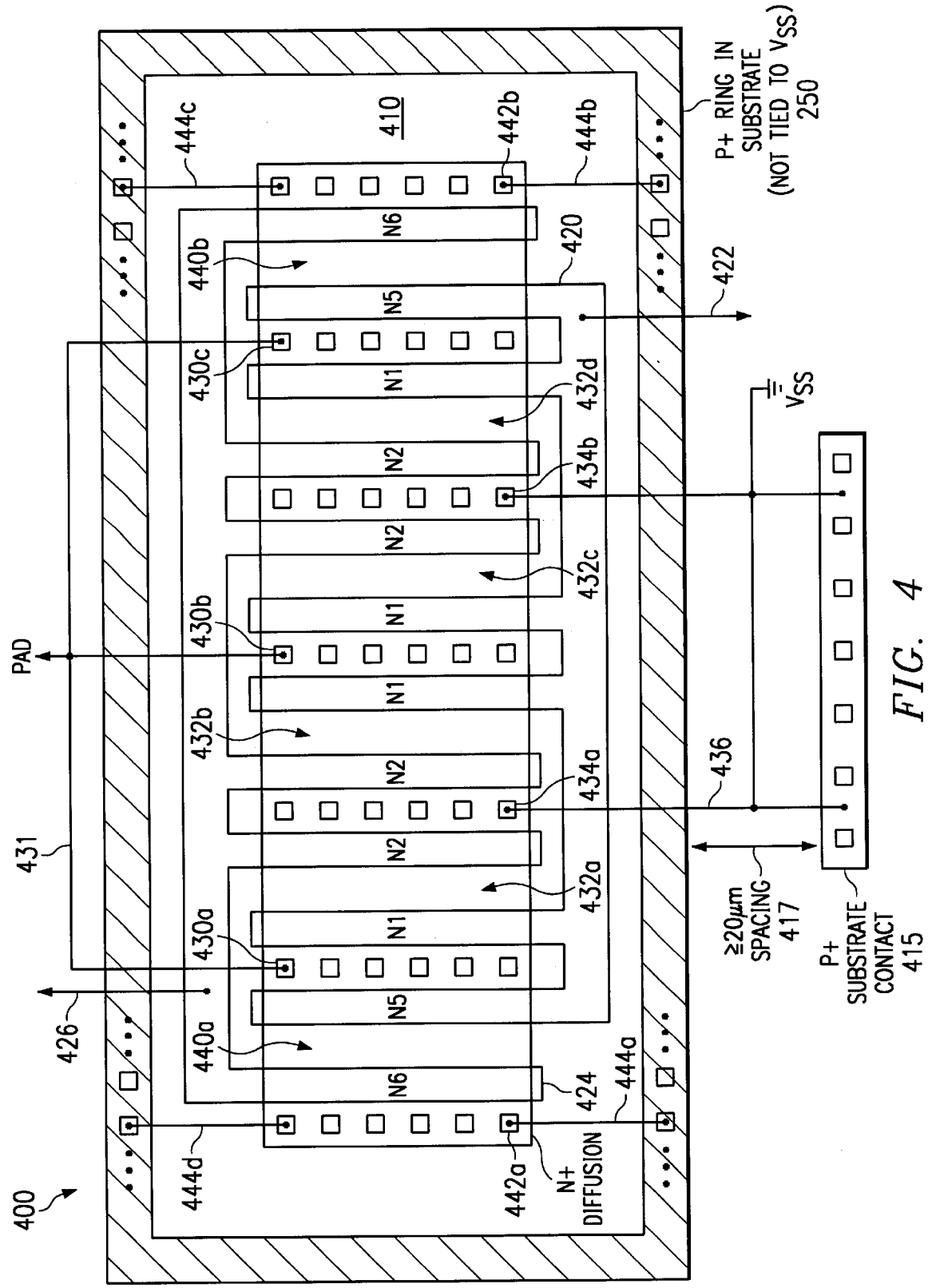
FIG. 4 is a topological diagram of the gate coupled device and pumping circuitry of the ESD protection circuitry.

FIG. 4 is a topological diagram of transistors N1, N2, N5 and N6. Only a portion of semiconductor substrate 400 is depicted. Remaining circuitry of integrated circuit 10 is formed on portions of semiconductor substrate 400 not shown. P+ ring 250 encloses a region 410 of the semiconductor substrate. Substrate contacts, such as contact 415, are spaced apart from P+ ring 250 a distance 417 so that region 410 can be voltage pumped by pump circuitry 202, as discussed earlier. In this embodiment, distance 417 is a minimum of 20 microns, however, in other embodiments distance 417 would be scaled to provide sufficient resistance between substrate contact 415 and P+ ring 250 to permit voltage pumping of region 410. Transistors N1 and N2 are formed within the region 410 so that their backgates can be voltage pumped by pump circuitry 202 in order to reduce their bipolar trigger voltage $V_{t1}$. Conductive member 420 forms gate 212 of multi-finger transistor N1, as well as the gate of transistor N5. Trace 422 connects these gates to control circuitry 204, not shown in this figure. Likewise, conductive member 424 forms gate 218 of multi-finger transistor N2, as well as the gate of transistor N6. Trace 426 connects these gates to control circuitry 204. Drain contacts 430a–c are connected to pad 113 via trace 431. Multi-fingered transistors N1 and N2 are interleaved, so the regions 432a–432d form both source 214 for transistor N1 and drain 216 for transistor N2. Source contacts 434a–434b connect source 220 of transistor N2 to Vss reference pad 232 via trace 436.

Likewise, regions 440a and 440b form the common source/drain of transistors N5 and N6. Drain contacts 430a and 430c also connect drain 248 of transistor N5 to signal pad 113 via trace 431. Source contacts 442a and 442b connect source 249 of transistor N6 to P+ ring 250 via traces 444a–444d.

Figure 5:
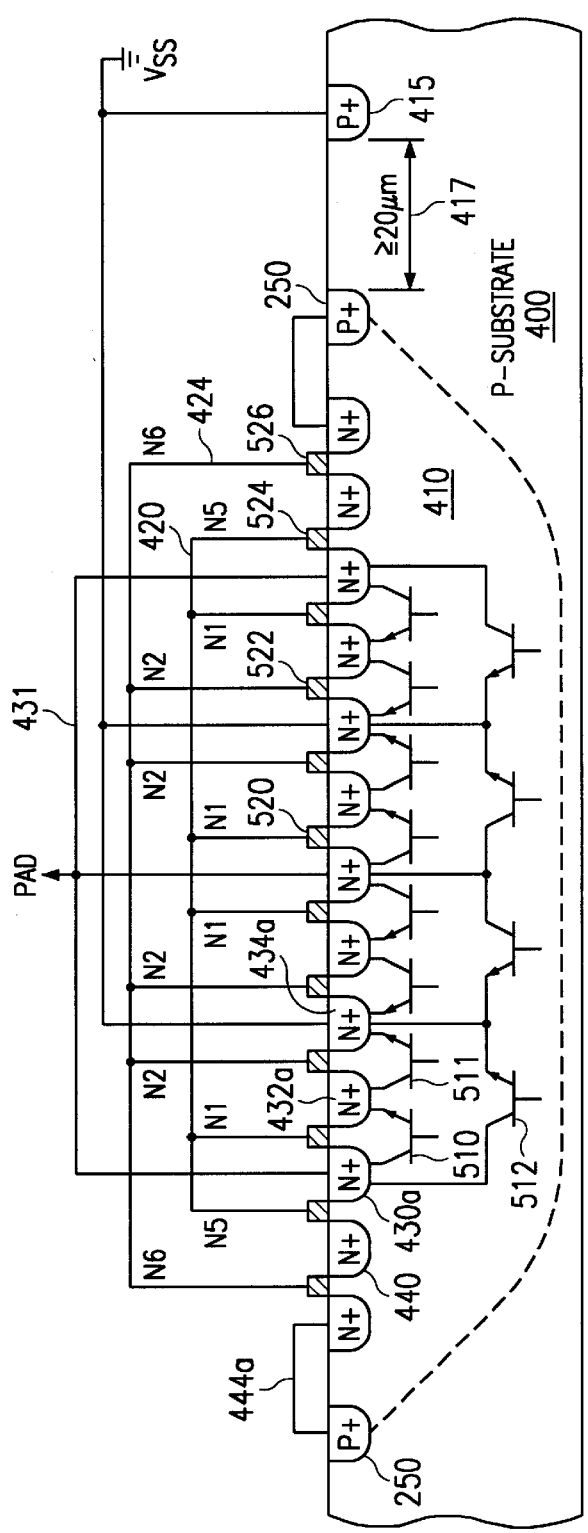
FIG. 5 shows cross sections of the devices illustrated in FIG. 4 with their parasitic lateral bipolar transistors.

FIG. 5 is a cross-sectional view of transistors N1, N2, N5 and N6 illustrating their parasitic lateral bipolar transistors. Only a portion of p-type semiconductor substrate 400 is depicted. Remaining circuitry of integrated circuit 10 is formed on portions of semiconductor substrate 400 not shown. P+ ring 250 encloses a region 410 of the semiconductor substrate. Substrate contacts, such as contact 415, are spaced apart from P+ ring 250 a distance 417 so that region 410 can be voltage pumped by pump circuitry 202, as discussed earlier. Parasitic NPN transistors, generally indicated by 510, corresponds to transistor N1. NPN parasitic transistors, generally indicated by 511, corresponds to transistor N2. Additional parasitic transistors, generally indicated as 512, are formed due to the multi-finger nature of transistors N1 and N2. These parasitic transistors are triggered into conduction in response to an ESD zap on signal pad 113. Advantageously, gate oxide for transistor N1, N2, N5 and N6, indicated at 520, 522, 524, and 526 for example, is fabricated to have the same thickness as the gate oxide for transistor in the internal circuitry of integrated circuit 10. The backgates of transistors N1 and N2, as well as N5 and N6, located under gate oxide 520 and 522 are formed in substrate region 410. According to aspects of the present invention, voltage pumping of region 410 in response to an ESD zap helps turn on parasitic transistors 510–512 before the thin gate oxide of transistors N1 and N2 is damaged by the ESD zap.

Fabrication of integrated circuit 10 involves multiple steps of implanting various amounts of impurities into a semiconductor substrate and diffusing the impurities to selected depths within the substrate to form transistor devices. Masks are formed to control the placement of the impurities. Multiple layers of conductive material and insulative material are deposited and etched to interconnect the various devices. These steps are performed in a clean room environment.

A significant portion of the cost of producing the data processing device involves testing. While in wafer form, individual devices are biased to an operational state and probe tested for basic operational functionality. The wafer is then separated into individual dice which may be sold as bare die or packaged. After packaging, finished parts are biased into an operational state and tested for operational functionality.

An advantage of the present invention is that gate oxide for ESD protection transistor is fabricated to have the same thickness as the gate oxide for transistors in the internal circuitry of an integrated circuit. The internal circuitry is operated at a Vdd voltage that is lower than the voltage of signals that are provided to the integrated circuit. Thus, the ESD circuitry also operates reliably with high voltage signals using low voltage transistors.

Advantageously, voltage pumping of the gates and backgates of the ESD protection transistors in response to an ESD zap helps turn on parasitic transistors in the ESD protection circuitry before the thin gate oxide of ESD protection transistors is damaged by the ESD zap.

As used herein, the terms "applied," "connected," and "connection" mean electrically connected, including where additional elements may be in the electrical connection path.

While the invention has been described with reference to illustrative embodiments, this description is not intended to be construed in a limiting sense. Various other embodiments of the invention will be apparent to persons skilled in the art upon reference to this description. For example, circuits with lower values of Vdd can be accommodated by including more than two transistors in the GCD and in the pumping circuitry strings. The ESD transistors can have a different number of fingers than illustrated. The shape of the P+ ring and the enclosed region of semiconductor substrate can be varied. It is therefore contemplated that the appended claims will cover any such modifications of the embodiments as fall within the true scope and spirit of the invention.

What is claimed is:

1. An integrated circuit, comprising:
    a semiconductor substrate connected to a reference bond pad for a reference supply voltage;
    a first bus for a first supply voltage;
    a first signal bond pad for connecting to an external signal, wherein the external signal is operable at approximately a second supply voltage, wherein the second supply voltage is higher than the first supply voltage;
    internal circuitry connected between the first bus and semiconductor substrate comprising MOS transistors having gate oxide with a first thickness having a $V_{ox-max}$ suitable for the first supply voltage but not for the second supply voltage;
    ESD circuitry connected between the signal pad and the reference bond pad, wherein the ESD circuitry comprises:
        a first substrate region in the semiconductor substrate enclosed by a highly doped region;
        a first string of cascode connected MOS transistors each having gate oxide of the first thickness, each with a backgate in the first substrate region, a first source/drain connected to the signal pond pad, a last source/drain connected to the reference bond pad, and a separate control gate associated with each of the MOS transistors in the first string;
        a second string of cascode connected MOS transistors each having a gate oxide of the first thickness, with a first source/drain connected to the signal bond pad, a last source/drain connected to the highly doped region, and a separate control gate associated with each of the MOS transistors in the second string; and
        control circuitry connected to the first signal bond pad and to each of the gates in the first string and the second string operable to provide a voltage pulse to each gate in the first string and to each gate in the second string in response to an ESD zap applied to the first signal bond pad.

2. The integrated circuit of claim 1, wherein the control circuitry comprises a plurality of capacitors each having a first terminal connected to the first signal bond pad, such that each control gate of the first string of MOS transistors is connected to a second terminal of a different one of the plurality of capacitors.

3. The integrated circuit of claim 2, wherein the plurality of capacitors are connected in series and wherein the plurality of capacitors are each an MOS device having a gate oxide with the first thickness having a $V_{ox-max}$ suitable for the first supply voltage but not for the second supply voltage.

4. The integrated circuit of claim 3, wherein the control circuitry further comprises a plurality of resistors connected such that respective resistors are connected to respective ones of the plurality of capacitors in a series manner.

5. The integrated circuit of claim 4, wherein a first resistor of the plurality of resistors has a terminal connected to the first bus, and a second resistor of the plurality of resistors has a terminal connected to the reference bond pad.

6. A digital system comprising:
    a first integrated circuit having an output buffer operable to provide an output signal on a first terminal having fist signal voltage level;
    a second integrated circuit having an output buffer with a signal bond pad connected to the first terminal, wherein the second integrated circuit further comprises:
        a semiconductor substrate connected to a reference bond pad for a reference supply voltage;
        a first bus for a first supply voltage, wherein the first signal voltage level is higher than the first supply voltage;
        internal circuitry connected between the first bus and semiconductor substrate comprising MOS transistors having gate oxide with a first thickness having a $V_{ox-max}$ suitable for the first supply voltage but not for the first signal voltage;
        ESD circuitry connected between the signal pad and the reference bond pad, wherein the ESD circuitry comprises:
            a first substrate region in the semiconductor substrate enclosed by a highly doped region;
            a first string of cascode connected MOS transistors each having gate oxide of the first thickness, each with a backgate in the first substrate region, a first source/drain connected to the signal pond pad, a last source/drain connected to the reference bond pad, and a separate control gate associated with each of the MOS transistors in the first string;
            a second string of cascode connected MOS transistors each having a gate oxide of the first thickness, with a first source/drain connected to the signal bond pad, a last source/drain connected to the highly doped region, and a separate control gate associated with each of the MOS transistors in the second string; and control circuitry connected to the first signal bond pad and to each of the gates in the first string and the second string operable to provide a voltage pulse to each gate in the first string and to each gate in the second string in response to an ESD zap applied to the first signal bond pad.

7. The integrated circuit of claim 6, wherein the control circuitry comprises a plurality of capacitors each having a first terminal connected to the first signal bond pad, such that each control gate of the first string of MOS transistors is connected to a second terminal of a different one of the plurality of capacitors.

8. The integrated circuit of claim 7, wherein the plurality of capacitors are connected in series and wherein the plurality of capacitors are each an MOS device having a gate oxide with the first thickness having a $V_{ox-max}$ suitable for the first supply voltage but not for the second supply voltage.

9. The integrated circuit of claim 8, wherein the control circuitry further comprises a plurality of resistors connected such that respective resistors are connected to respective ones of the plurality of capacitors in a series manner.

10. The integrated circuit of claim 9, wherein a first resistor of the plurality of resistors has a terminal connected to the first bus, and a second resistor of the plurality of resistors has a terminal connected to the reference bond pad.

11. A method for providing electrostatic protection for an integrated circuit, wherein the integrated circuit has internal circuitry operable at a first supply voltage and a first signal bond pad for connecting to an external signal, wherein the external signal is operable at approximately a second supply voltage and the second supply voltage is higher than the first supply voltage, and wherein the internal circuitry has MOS transistors with gate oxide having a first thickness with a $V_{ox-max}$ suitable for the first supply voltage but not for the second supply voltage, comprising the steps of:

enclosing a first substrate region in a semiconductor substrate of the integrated circuit by a highly doped region;

connecting a first string of cascode connected MOS transistors having gate oxide of the first thickness between the signal bond pad and a reference bond pad, such that a backgate of each is in the first substrate region;

connecting a second string of cascode connected MOS transistors having a gate oxide of the first thickness between the signal bond pad and the highly doped region, coupling control gates of the first string of cascode connected MOS transistors and control gates of the second string of cascode connected MOS transistors to the signal bond pad;

pumping the first substrate region in response to an ESD zap applied to the first signal bond pad by turning on the second string of cascode connected MOS transistors via the coupled control gates; and turning on the first string of cascode connected MOS transistors in response to the ESD zap via the coupled control gates before the second string of cascode connected transistors and the internal circuitry is damaged by the ESD zap.

12. The method of claim 11, further comprising the step of overriding the step of coupling during normal operation when the second supply voltage is provided to the integrated circuit.

* * * * *